United States Patent [19]
Yang et al.

[11] Patent Number: 6,017,821
[45] Date of Patent: Jan. 25, 2000

[54] CHEMICAL-MECHANICAL POLISHING METHOD FOR FORMING PLUGS

[75] Inventors: Sen-Shan Yang; Jye-Yen Cheng, both of Taichung, Taiwan

[73] Assignee: Winbond Electronics Corp., Taiwan

[21] Appl. No.: 08/958,934

[22] Filed: Oct. 28, 1997

[30] Foreign Application Priority Data

Jul. 18, 1997 [TW] Taiwan ................................. 86110196

[51] Int. Cl.[7] ..................................................... H01L 21/00
[52] U.S. Cl. ........................... 438/692; 438/738; 438/742
[58] Field of Search ..................... 438/690, 691, 438/692, 678, 656, 738, 742; 257/750

[56] References Cited

U.S. PATENT DOCUMENTS

| 5,618,381 | 4/1997 | Doan et al. | 438/633 |
|---|---|---|---|
| 5,730,835 | 3/1998 | Roberts et al. | 156/656 |
| 5,795,828 | 8/1998 | Endo et al. | 438/678 |
| 5,814,557 | 9/1998 | Venkatraman et al. | 438/622 |
| 5,861,344 | 1/1999 | Roberts et al. | 438/738 |

*Primary Examiner*—Benjamin Utech
*Assistant Examiner*—Kin-Chan Chen
*Attorney, Agent, or Firm*—Rabin & Champagne, PC

[57] ABSTRACT

A method for forming plugs using chemical-mechanical polishing, which includes providing a conductive layer having an inter-layer dielectric formed thereon; then, forming a contact hole in the inter-layer dielectric exposing portions of the conductive layer. Thereafter, a diffusion barrier layer and a glue layer are sequentially formed over the inter-layer dielectric and the exposed conductive layer. Next, a first metallic layer is deposited over the glue layer, and then etched back to form a residual first metallic layer. Subsequently, a second metallic layer is deposited over the glue layer and the residual first metallic layer. Finally, chemical-mechanical polishing is used to remove the second metallic layer above the inter-layer dielectric to form a metal plug. By depositing plug metal in stages, exposed cavities are no longer formed after a CMP operation is performed, thus avoiding the problem of CMP slurry getting inside a metal plug.

13 Claims, 4 Drawing Sheets

CHEMICAL-MECHANICAL POLISHING METHOD FOR FORMING PLUGS

BACKGROUND OF THE INVENTION

1. Field of Invention

The present invention relates to a method of forming a via plug or a contact plug, and more particularly to a method of removing a keyhole formation within a tungsten plug inside a via hole or a contact hole after a chemical-mechanical polishing operation is performed.

2. Description of Related Art

Contact plugs and via plugs (hereinafter "plugs") are devices for interconnecting different conducting layers (metallic layers) in an integrated circuit component. A plug is manufactured by first forming an inter-layer dielectric above a first conductive layer, and then selectively etching the inter-layer dielectric to form a contact hole exposing portions of the first conducting area. Then, a barrier layer and a glue layer are formed lining the contact hole. Subsequently, metal, such as tungsten, is deposited into the contact hole, and then the metal is etched back to form a conductive plug. Thereafter, a second conductive material is deposited over the inter-layer dielectric to form a second conductive layer. As a result, the two conductive layers are connected through a conductive plug inside a contact hole.

At present, the etching back of the deposited metal to form the conductive plug is typically performed using a chemical-mechanical polishing operation. However, because of the formation of an overhang in the glue layer near the top end of the contact hole, a keyhole is formed in the conductive plug.

FIGS. 1a, 1b, and 1c are cross-sectional views showing the manufacturing progression of a tungsten plug according to a conventional method. To simplify explanations, processes unrelated to the present invention are omitted and the description starts after a conductive layer 10 is formed.

First, as shown in FIG. 1a, an inter-layer dielectric 12 is formed over conductive layer 10. Then, a portion of the inter-layer dielectric 12 is etched to form a contact hole 14 exposing portions of the conductive layer 10.

Next, in FIG. 1b, a diffusion barrier layer 16 and a glue layer 18 are sequentially formed over the inter-layer dielectric 12 and the exposed portions of the conductive layer 10. The diffusion barrier layer 16 can be, for example, a titanium (Ti) layer, and the glue layer 18 can be a titanium nitride (TiN) layer. The diffusion barrier layer 16 and the glue layer 18 serve to prevent a direct contact of the conductive layer 10 with a subsequently formed plug metal layer, and serve to increase the bonding strength between the conductive layer 10 and the subsequently formed plug metal layer.

Thereafter, a metallic layer 20, for example, a tungsten layer having a thickness of about 8000 Å, is deposited over the glue layer 18, which also fills the contact hole 14. However, due to the presence of an overhang 18a formed when the glue layer 18 is first formed, a keyhole 22 is formed within the metal layer 20 inside the contact hole 14.

Finally, as shown in FIG. 1c, a chemical-mechanical polishing (CMP) operation is performed to remove the metallic layer 20 above the inter-layer dielectric 12 to form a plug 24. Because of the keyhole 22 formed in the previous operation, a cavity 22a is also formed. Since the cavity 22a inside the metal plug is exposed, slurry from the CMP operation can easily get inside the cavity, causing reliability problems in the subsequently formed integrated circuit. In light of the foregoing, there is a need in the art to provide a method of covering, the plug cavity.

SUMMARY OF THE INVENTION

Accordingly, the present invention is directed to a method of improving the situation caused by the keyhole formation, in which plug metal is deposited in stages so that exposed cavities are not formed after the CMP operation, and so that CMP slurry getting inside the metal plug is avoided.

To achieve these and other advantages and in accordance with a purpose of the invention, as embodied and broadly described herein, the invention includes a method of forming plugs, comprising providing a conductive layer having an inter-layer dielectric formed thereon, then, forming a contact hole in the inter-layer dielectric to expose a portion of the conductive layer. Thereafter, a diffusion barrier layer and a glue layer are sequentially formed over the inter-layer dielectric and the exposed conductive layer. Next, a first metallic layer is deposited over the glue layer, and then the first metallic layer is etched back to form a residual first metallic layer. Subsequently, a second metallic layer is deposited over the glue layer and the residual first metallic layer. Finally, chemical-mechanical polishing is used to remove the second metallic layer above the inter-layer dielectric to form a metal plug.

It is to be understood that both the foregoing general description and the following detailed description are exemplary, and are intended to provide further explanations of the invention as claimed.

BRIEF DESCRIPTION OF THE DRAWINGS

The accompanying drawings are included to provide a further understanding of the invention and are incorporated in and constitute a part of this specification. The drawings illustrate an embodiment of the invention and, together with the description, serve to explain the principles of the invention. In the drawings.

DESCRIPTION OF THE PREFERRED EMBODIMENT

Figure 1A:
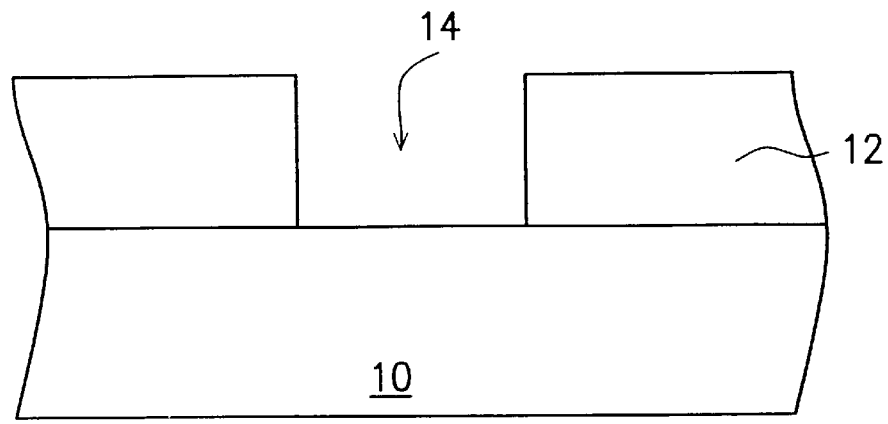
FIGS. 1a, 1b, 1c are cross-sectional views showing the progression of production of a tungsten plug according to a conventional method.
Figure 1B:
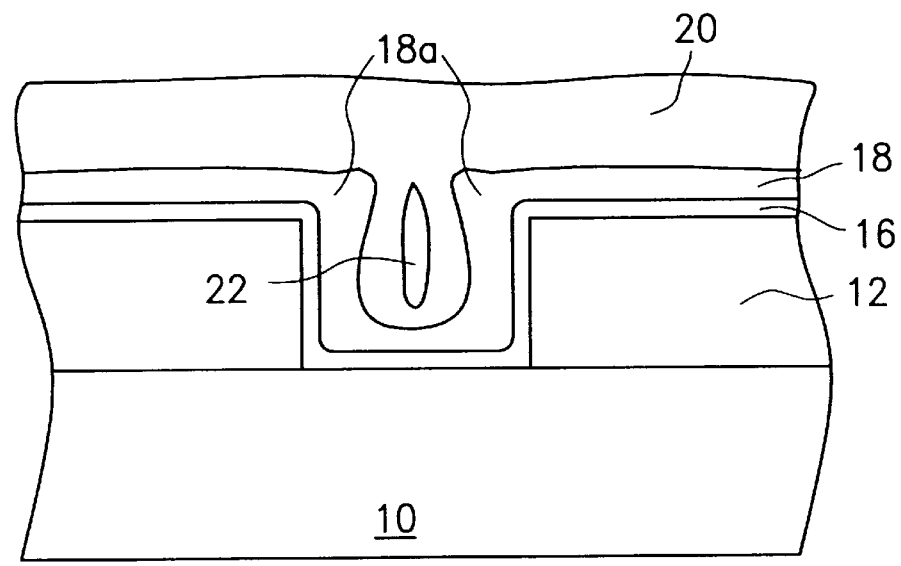
Figure 1C:
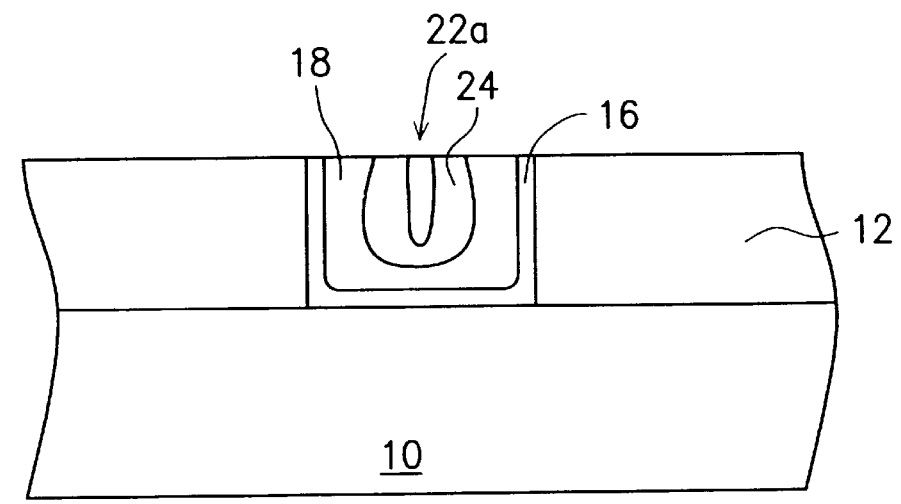

Reference will now be made in detail to the present preferred embodiment of the invention, an example of which is illustrated in the accompanying drawings. Wherever possible, the same reference numbers are used in the drawings and the description to refer to the same or like parts.

FIGS. 2a, 2b, 2c, 2d, and 2e are cross-sectional views showing the progression of the production of a tungsten plug according to a preferred embodiment of this invention. To simplify explanations, processes unrelated to the present invention are omitted and the description starts after a conductive layer 30 is formed.

Figure 2A:
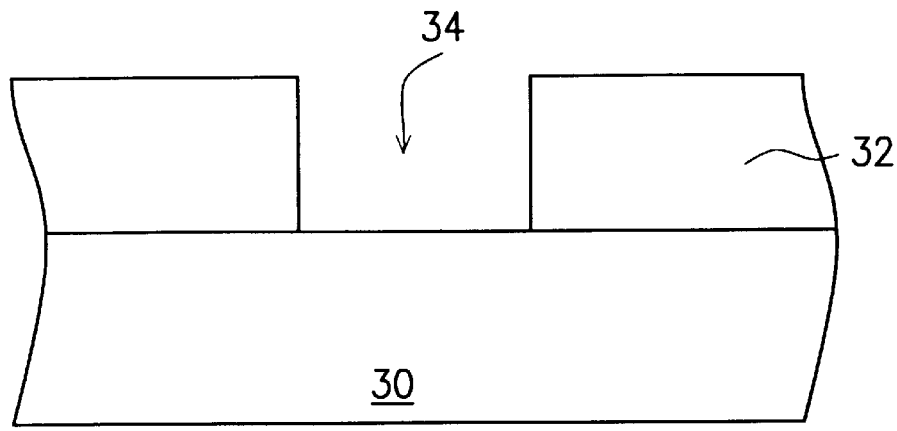
FIGS. 2a, 2b, 2c, 2d and 2e are cross-sectional views showing the progression of the production of a tungsten plug according to a preferred embodiment of this invention.

First, as shown in FIG. 2a, an inter-layer dielectric 32 is formed over conductive layer 30. Then, a portion of the inter-layer dielectric 32 is etched to form a contact hole 34 exposing portions of the conductive layer 30.

Figure 2B:
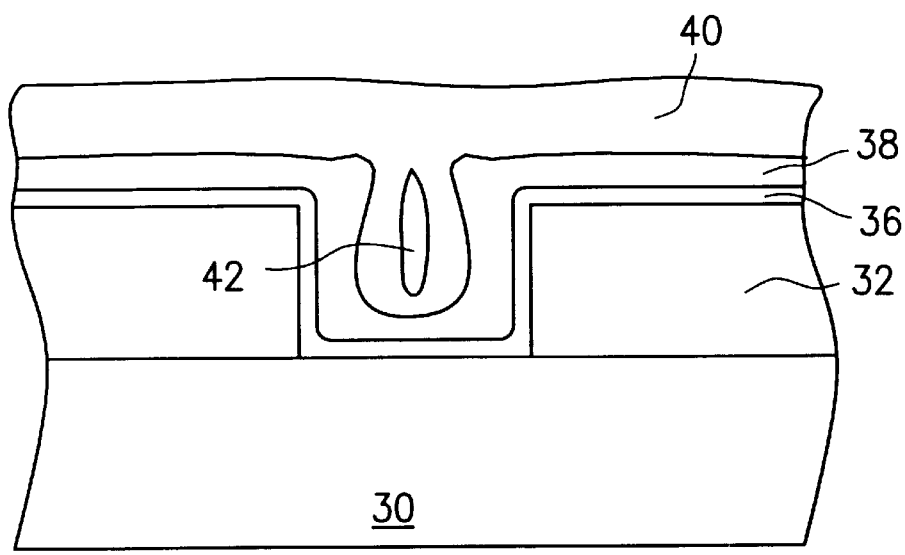

Next, in FIG. 2b, a diffusion barrier layer 36 and a glue layer 38 are sequentially formed over the inter-layer dielectric 32 and the exposed portions of the conductive layer 30. The diffusion barrier layer 36 can be, for example, a titanium (Ti) layer and the glue layer 38 can be a titanium nitride (TiN) layer. The diffusion barrier layer 36 and the glue layer 38 serve to prevent a direct contact of the conductive layer 30 with the subsequently formed plug metal layer, and serve to increase the bonding strength between the conductive layer 30 and the subsequently formed plug metal layer. Thereafter, a first metallic layer 40, for example, a tungsten layer having a thickness of about 8000 Å, is deposited over the glue layer 38 which fills the contact hole 34. However, due to the presence of an overhang of glue layer 38, a keyhole 42 is formed within the metallic layer 40 inside the contact hole 34.

Figure 2C:
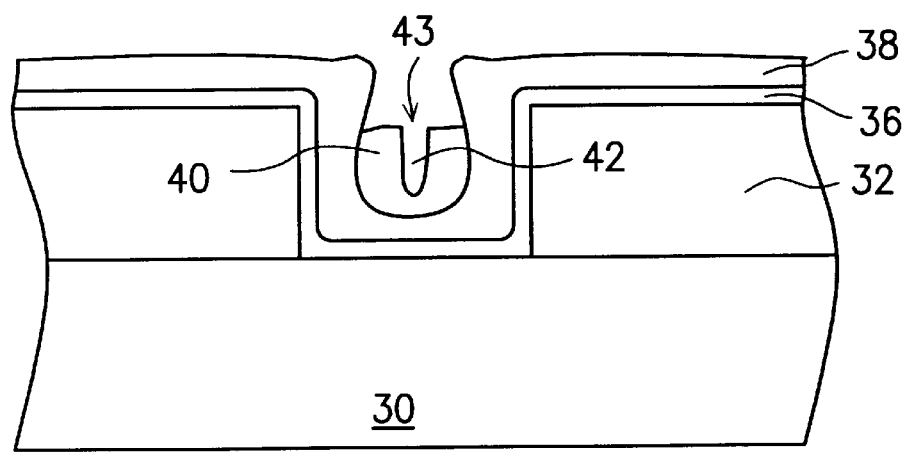

Next, in FIG. 2c, the first metallic layer 40 is etched back to partially remove the keyhole 42. The etching back should be carefully timed to avoid over-removing the glue layer 38, or worse, etching into the inter-layer dielectric 32. The etching time for the first metallic layer 40 is preferable about 150 to 200% of the normal etching back time for a metallic layer having the same thickness. In other words, if a period of time t is required for the complete removal of the metallic layer 40 above the titanium nitride glue layer 38 in a conventional method, then the proper etching time should be about 1.5 t to 2 t. With proper etching, a cavity 43 is etched out from the keyhole 42.

Figure 2D:
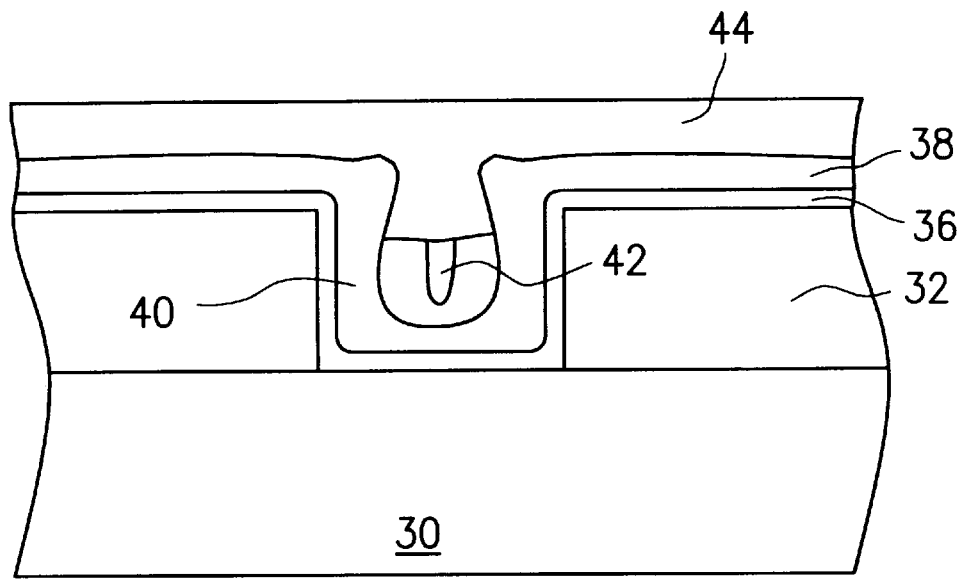

Subsequently, as shown in FIG. 2d, a second metallic layer 44 is deposited over the titanium nitride glue layer 38. For example, a tungsten layer having a thickness of about 3000 Å is deposited. A portion of the second metallic layer 44 will get into the keyhole 42 to fill up the remaining space inside the cavity 43.

Figure 2E:
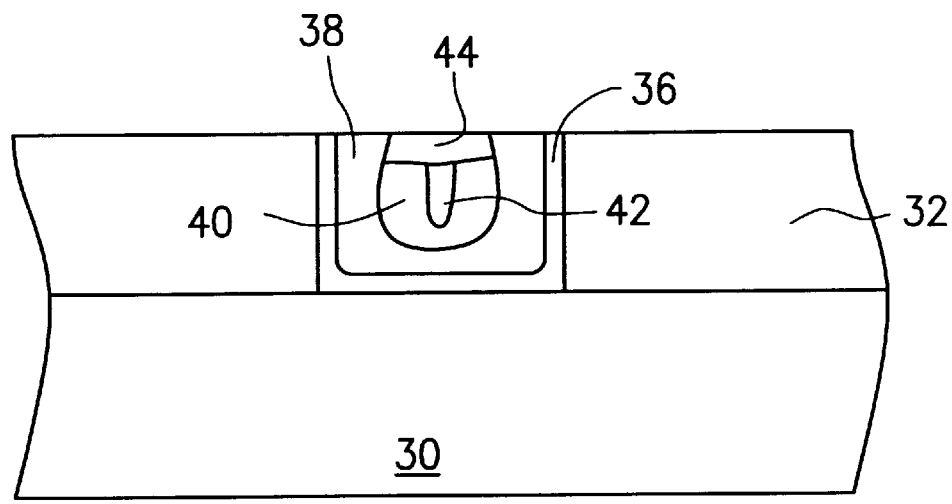

Finally, as shown in FIG. 2e, a chemical-mechanical polishing (CMP) operation is performed to remove the second metallic layer 44 above the inter-layer dielectric 32 to form a plug. Since an exposed cavity is not produced during the CMP operation, slurry will not be retained inside a cavity, which would otherwise cause reliability problems, as in the conventional method of plug formation.

Consequently, the metal plug formed according to the above preferred embodiment of this invention has the following advantages:

(1) The conventional method of plug formation uses CMP techniques because CMP is capable of global planarization. As such, after the removal of the metallic layer above the inter-layer dielectric, the deposited metal inside the contact hole is in a better condition than by an etching back operation. The present invention utilizes the CMP techniques, but eliminates the conventional formation of an exposed cavity in the plug metal after the CMP operation is performed. Therefore, subsequent reliability problems are avoided.

(2) To avoid keyhole formation, the conventional methods use chemical vapor deposition (CVD) processes for forming the glue layer so that overhangs are minimized.

However, there is no need for using such CVD processes in the present invention. Therefore, the whole manufacturing process can be simplified.

Experiments have been conducted following the operations stated in the preferred embodiment of the invention. The experimental processes include: (1) depositing a tungsten layer having a thickness of about 3000 Å, as shown in FIG. 2b; (2) etching back the tungsten layer using a time equivalent to 200% of the conventional etching back time of the tungsten layer, as shown in FIG. 2c; (3) depositing another tungsten layer having a thickness of about 3000 Å, as shown in FIG. 2d; and (4) using chemical-mechanical polishing to complete the formation of a tungsten plug.

Figure 3A:
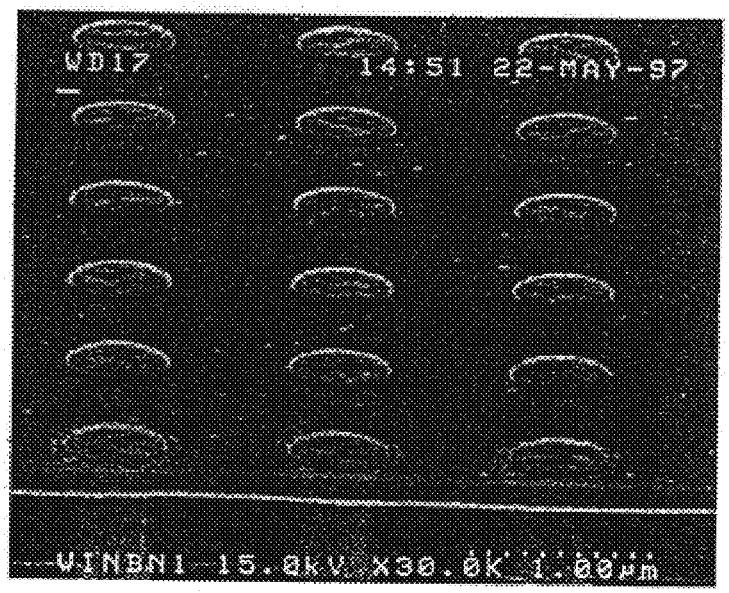
FIG. 3a are scanning electron microscope (SEM) photographs taken from the top showing tungsten plugs after a chemical-mechanical polishing (CMP) operation is performed according to this invention.
Figure 3B:
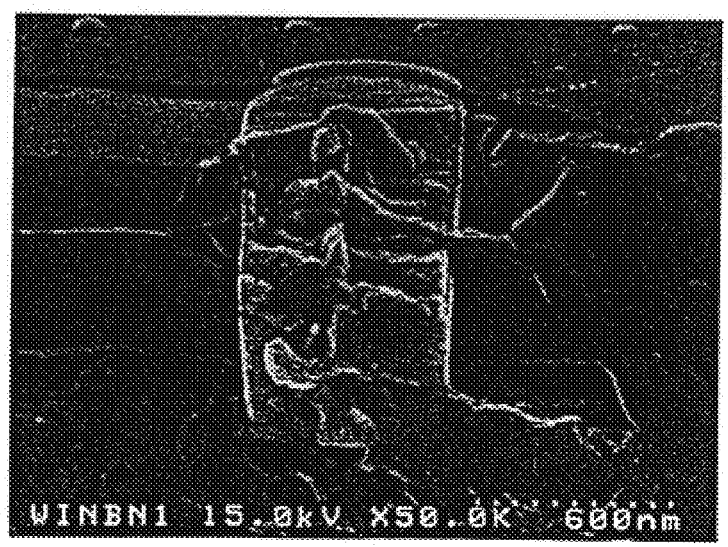
FIG. 3b is a SEM photograph taken from the side of a cross-section through a tungsten plug after the CMP operation is performed according to the invention.

The result of the experiments can be seen in the scanning electron microscope (SEM) photographs of FIGS. 3a through 3c. FIGS. 3a and 3b are scanning electron microscope (SEM) photographs taken from the top, showing tungsten plugs after a chemical-mechanical polishing (CMP) operation is performed according to this invention. As shown in FIG. 3a, no exposed cavities are seen. FIG. 3b is an SEM photograph taken from the side of a cross-section through a tungsten plug after a CMP operation is performed according to the invention. As shown in FIG. 3b, the keyhole has been fully covered by the re-deposited tungsten after the etching back treatment. This shows that the invention is capable of eliminating the problems caused by keyhole formation.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of forming plugs, comprising:
   providing a conductive layer having an inter-layer dielectric formed thereon;
   forming a contact hole in the inter-layer dielectric to expose a portion of the conductive layer;
   forming a glue layer over the inter-layer dielectric and the exposed portion of the conductive layer;
   depositing a first metallic layer over the glue layer and filling the contact hole;
   etching back the first metallic layer to remove most of the first metallic layer, thereby exposing the glue layer over the inter-layer dielectric and leaving a residual portion of the first metallic layer only inside a bottom part of the contact hole;
   depositing a second metallic layer over the glue layer and the residual portion of the first metallic layer to completely fill the contact hole; and
   removing the second metallic layer above the inter-layer dielectric using chemical-mechanical polishing to form a metallic plug that is free of any exposed cavities.

2. The method of claim 1, wherein said glue layer consists of a titanium layer and a titanium nitride layer.

3. The method of claim 2, wherein said etching back includes etching for a period of time equal to 1.5 to 2 times a period of time required to completely remove the first tungsten layer above the titanium nitride layer by etching.

4. The method of claim 1, wherein said first metallic layer includes a tungsten layer.

5. The method of claim 1, wherein said second metallic layer includes a tungsten layer.

6. The method of claim 1, wherein said depositing a first metallic layer includes depositing the first tungsten layer to a thickness of about 3000 Å.

7. The method of claim 1, wherein said depositing a second metallic layer includes depositing the second tungsten layer to a thickness of about 3000 Å.

8. A method of forming a plug, comprising:
   providing a conductive layer having an inter-layer dielectric formed thereon;

forming a contact hole in the inter-layer dielectric to expose a portion of the conductive layer;

sequentially forming a diffusion barrier layer and a glue layer over the inter-layer dielectric and the exposed portion of the conductive layer;

depositing a first metallic layer over the glue layer and filling the contact hole;

etching back the first metallic layer to remove most of the first metallic layer, thereby exposing the glue layer over the inter-layer dielectric and leaving a residual portion of the first metallic layer only inside a bottom part of the contact hole;

depositing a second metallic layer over the glue layer and the residual portion of the first metallic layer to completely fill the contact hole; and removing the second metallic layer above the inter-layer dielectric using chemical-mechanical polishing to form a metal plug that is free of any exposed cavities.

9. The method of claim 8, wherein said sequentially forming includes depositing a titanium layer and a titanium nitride layer.

10. The method of claim 8, wherein said depositing a first metallic layer includes forming a tungsten layer having a thickness of about 3000 Å.

11. The method of claim 8, wherein said etching back includes etching for a period of time equal to 1.5 to 2 times a period of time required to completely remove the first metallic layer above the glue layer by etching.

12. The method of claim 8, wherein said depositing a second metallic layer includes forming a tungsten layer having a thickness of about 3000 Å.

13. A method of forming plugs, comprising:

providing a conductive layer having an inter-layer dielectric formed thereon;

forming a contact hole in the inter-layer dielectric to expose a portion of the conductive layer after the inter-layer dielectric is formed;

forming a glue layer over the inter-layer dielectric and the exposed portion of the conductive layer;

depositing a first metallic layer over the glue layer and filling the contact hole after the contact hole is formed;

etching back the first metallic layer to remove most of the first metallic layer, thereby exposing the glue layer and leaving a portion of the first metallic layer only inside a bottom part of the contact hole;

depositing a second metallic layer over the glue layer and the first metallic layer; and removing the second metallic layer above the inter-layer dielectric by chemical-mechanical polishing to form a metallic plug.

* * * * *